United States Patent [19]

Bukhman et al.

[11] Patent Number: 5,795,493
[45] Date of Patent: Aug. 18, 1998

[54] LASER ASSISTED PLASMA CHEMICAL ETCHING METHOD

[75] Inventors: Yefim Bukhman, Scottsdale; Edward M. Keller, Tempe, both of Ariz.

[73] Assignee: Motorola, Inc., Schaumburg, Ill.

[21] Appl. No.: 432,556

[22] Filed: May 1, 1995

[51] Int. Cl.[6] .................................................. H01L 21/00
[52] U.S. Cl. ................... 216/59; 156/643.1; 156/662.1; 216/59; 216/60; 216/65; 216/67
[58] Field of Search ................... 156/626.1, 643.1, 156/662.1, 345; 216/60, 65, 66, 59, 67

[56] References Cited

U.S. PATENT DOCUMENTS

| | | | |
|---|---|---|---|
| 5,183,531 | 2/1993 | Terakado | 216/51 X |
| 5,223,080 | 6/1993 | Ohta et al. | 216/2 |
| 5,254,830 | 10/1993 | Zarowin et al. | 219/121.43 |
| 5,375,064 | 12/1994 | Bollinger | 156/345 |
| 5,376,215 | 12/1994 | Ohta et al. | 216/79 X |
| 5,376,224 | 12/1994 | Zarowin | 156/643 |
| 5,393,370 | 2/1995 | Ohta et al. | 156/345 X |

Primary Examiner—Thi Dang
Attorney, Agent, or Firm—Rennie William Dover

[57] ABSTRACT

A scaleable laser and control unit (58) is used to differentially heat portions of a semiconductor substrate (40) during downstream etching. Such differential heating provides a differential etch rate for each portion heated resulting in improved uniformity and reduced etch induced surface damage. An etching chamber (50) capable of containing the downstream plasma and providing a direct line of sight between the substrate (40) and the scanable laser unit (58) is provided. In addition, the system provides for dynamic updating of the process by in situ etch rate and temperature measurements.

16 Claims, 3 Drawing Sheets

LASER ASSISTED PLASMA CHEMICAL ETCHING METHOD

The present invent relates in general to etching semiconductor wafers more particularly to etching semiconductor material to produce very thin, uniform device layers.

BACKGROUND OF THE INVENTION

It is well known in the manufacture of advanced semiconductor devices such as those utilizing wafer to wafer bonding techniques, for example silicon on insulator (SOI) devices, that the most critical elements to be controlled are the final thickness of the device wafer, the uniformity of that thickness and maintenance of the surface quality of the semiconductor layer that remains. While the final thickness required for the device wafer is a function of the type of device technology being fabricated, a high degree of both uniformity of thickness and of surface quality is essential to high yields for all device technologies.

The most widely used technologies employed for device wafer thinning are mechanical grinding and chemical-mechanical polishing. However, these technologies cannot achieve the necessary degree of process control for all three critical factors. Thus while the current practical limits of these conventional technologies is a final layer thickness of approximately 2 to 3 µm with a uniformity or total thickness variation (TTV) of 0.5 to 1 µm, these values are far from the final layer thickness of less than 1 µm and TTV of less than 0.01 µm that will be required by advanced complementary metal oxide silicon (CMOS) and combined bipolar and CMOS (BIMOS) devices of the near future.

In addition, it is well known that mechanical grinding and chemical-mechanical polishing damage the surface of the device wafer. Thus the high surface quality required can only be achieved through additional processing subsequent to the wafer thinning process. These additional process steps add additional cost and complexity to wafer fabrication.

Recently a tool for plasma assisted chemical etching (PACE) has been introduced by Hughes Danbury Optical Systems, Inc. (HDOS). PACE makes use of a spatially confined plasma that can be scanned over the device wafer surface to control material removal. The dwell time of the spatially confined plasma, as the device wafer surface is scanned, is made proportional to the relative thickness of any portion of that surface. Thus TTV is reduced by removing more material from those areas having the greatest thickness. The etching process is similar to conventional plasma etching but is reported to use relatively low energy (much less than 1 electron volt) neutrals rather than energetic ions as is the case for reactive ion etching.

While the PACE tool claims significant improvement in both the final thickness obtainable and TTV, additional improvements in TTV to the levels required may be difficult to achieve due to the relatively large size of the region of spatially confined plasma. While the PACE system claims to use relatively low energy neutrals in its spatially confined plasma region, it is believed that relatively high voltages must be maintained to achieve adequate etch rates. These relatively high voltages can create radiation damage that will degrade the surface quality of the semiconductor layer that remains. In addition, the PACE requires mechanical motion within the process chamber to move the spatially confined plasma across the wafer surface. As one skilled in the art is aware, any mechanical motion during wafer processing can be a source of particulate contamination, often a significant factor in poor surface quality. Finally, the PACE system's utilization of a confined plasma discharge limits wafer throughput, thus increasing cost.

Therefore there exists a need for an improved method of thinning device wafers used in manufacturing advanced semiconductor devices such as those utilizing wafer to wafer bonding techniques. In particular, there exists the need for an improved method of thinning the device wafer that is not dependent upon mechanical grinding, chemical-mechanical polishing or upon a dry etch technique using a relatively large, spatially confined plasma area. Such an improved method must be capable of producing extremely thin, uniform layers that possess high device layer quality. Finally there exists a need to produce such high quality device layers promptly, in large quantities and at relatively low cost.

DETAILED DESCRIPTION OF THE DRAWINGS

The method and apparatus of the present invention etches semiconductor material by the application of a laser assisted plasma chemical etch (LAPCE). The LAPCE apparatus is designed to provide a capability of differentially heating selected portions of semiconductor material during a plasma chemical etch process, thus varying the etch rate of semiconductor material between such differentially heated portions. By controlling this differential heating capability, the method and apparatus of the present invention provides a means of obtaining an extremely uniform semiconductor substrate with high final surface quality. It is understood, that the term "semiconductor material," as used herein includes, but is not limited to single crystal silicon, polysilicon, amorphous silicon and III–V semiconductor material. In addition, it is understood that the term "semiconductor substrate" or "wafer substrate," as used herein includes, but is not limited to semiconductor material in the form of a homogeneous wafer, a multi-layered wafer or a film on a substrate.

Figure 1:
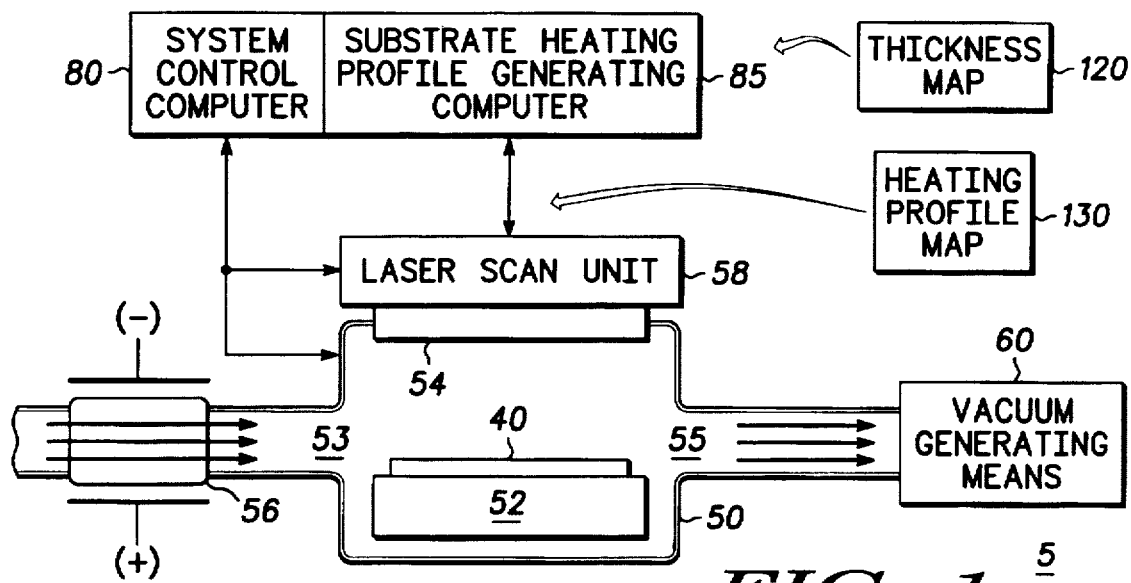
FIG. 1 is a schematic representation of a portion of a Laser Assisted Plasma Chemical Etch (LAPCE) system.

Referring now to FIG. 1, a simplified representation of a LAPCE system 5 is illustrated. The LAPCE system includes system control computer 80, substrate heating profile generating computer 85, etching chamber 50 and vacuum generating apparatus 60.

System control computer 80 is basically a computer capable of controlling the overall functioning of the LAPCE system, for example gas flow, vacuum, and the sequencing of all such system operations. Control computer 80 can be a general purpose digital computer with software programmed for LAPCE system control functionality or alternatively the functionality of control computer 80 can be effected by a dedicated hardware implementation or any combination of hardware and software that provides the desired functionality.

Substrate heating profile generating computer 85 is a computer capable of converting a thickness profile map 120 of semiconductor substrate 40 into a heating profile map 130 of substrate 40. Thickness profile map 120 is generated from thickness and location or position data measured for each portion of a plurality of portions of semiconductor substrate 40. Stand-alone thickness measurement and thickness profile generating systems are commercially available. Therefore, it is possible to provide thickness profile map 120 of substrate 40 to heating profile generating computer 85 from such a stand-alone system. Alternatively, the LAPCE system can comprise the functionality of such thickness and position measurements. It should thus be apparent to those skilled in the art that, stand-alone thickness measurement and thickness profile generating systems, integrated thickness measurement and thickness profile generating modules or any combination of the two can be employed by the present invention, and that the scope of the present invention encompasses all such combinations capable of generating a thickness profile map 120 for use by the LAPCE system. In addition, the size of each portion of semiconductor substrate 40 measured, and subsequently differentially heated, can be very small. Typically, this size is much smaller than the size obtainable by employing a spatially confined plasma. Thus heating profile map 130 identifies an amount of heating that each portion of semiconductor substrate 40 requires.

Etching chamber 50 is configured to contain a downstream plasma. As is well known to those skilled in the art, downstream plasma etching is widely regarded as the least damaging of the dry etching technologies, thus providing for potentially the highest quality final layers. A carrier gas, containing a reactive chemical or mixture of reactive chemicals, is passed through reactive species generating means 56, for example a microwave cavity, and the carrier gas containing the reactive species is directed into etching chamber 50 through inlet port 53. It is well understood that the choice of a reactive chemical, or mixture of reactive chemicals, is determined by the nature of the semiconductor material to be etched. For example a mixture of carbon tetrafluoride ($CF_4$) and oxygen is suitable for etching silicon. Etching chamber 50 further includes transparent window 54 forming one wall or a portion of a wall of etching chamber 50. Substrate 40 is positioned on temperature controlled chuck 52 which is used to maintain substrate 40 at a predetermined temperature. This enables one to maximize the differential heating and overall etch rate of substrate 40. Transparent window 54 is positioned so that semiconductor substrate 40 is in a direct line of sight to a laser scan unit 58, shown mounted externally to etching chamber 50 in FIG. 1. Laser scan unit 58 is capable of directing an optical heating beam through transparent window 54 to portions of semiconductor substrate 40. Laser scan unit 58 is able to scan essentially the entire semiconductor substrate 40 and selectively heat particular portions of semiconductor substrate 40, as per heating profile map 130.

Etching chamber 50 further comprises outlet port 55 which is coupled to vacuum generating apparatus 60 which serves to maintain etching chamber 50 at a sub-atmospheric pressure. This is consistent with well known downstream plasma etching processing.

It should be understood that the configuration of etch chamber 50 may be varied for particular applications. The position and nature of reactive species generation means 56, inlet port 53, outlet port 55 and other particulars of etching chamber 50 are individually configurable. Therefore the configuration of the aforementioned non-essential elements is not critical, in general, to the proper functioning of the present invention. However, the relative position of transparent window 54 must allow direct line of sight between semiconductor substrate 40 and laser scan unit 58.

It should be apparent, that LAPCE etching chamber 50, as described, will encompass no mechanical motion within the etching chamber during processing thus eliminating this major potential source of contamination. In addition, it should be apparent that the LAPCE system is capable of etching all portions of substrate 40 at all times, thus providing an increased throughput as compared to systems utilizing a spatially confined plasma.

Figure 2:
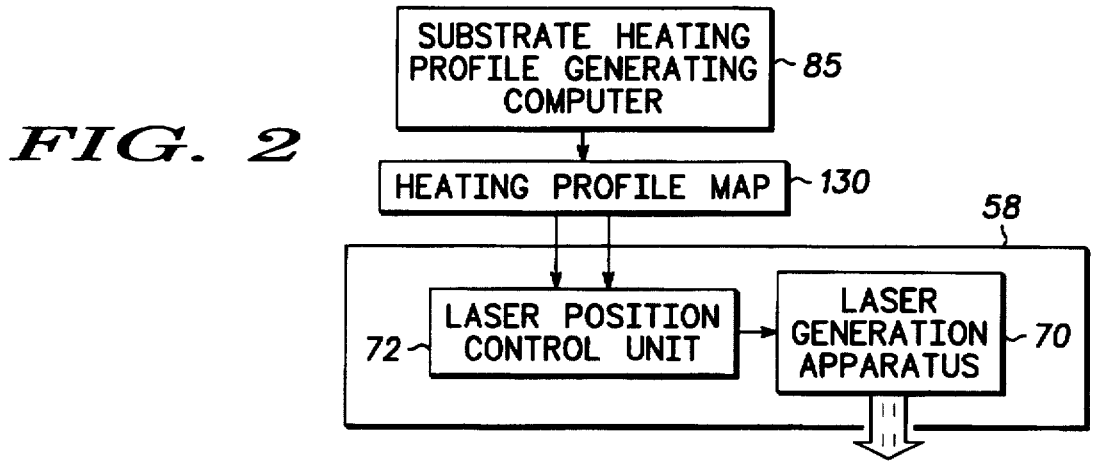
FIG. 2 is a schematic representation of an embodiment of a laser scan unit of a LAPCE chamber.

In FIG. 2 laser scan unit 58 comprises heating apparatus 70 and position control unit 72. Heating apparatus 70 can comprise any high energy optical source capable of being focused to and absorbed by all portions of substrate 40, through transparent window 54 (see FIG. 1). In addition, heating apparatus 70 must be capable of having its energy output modulated to generate differential heating. A laser is well known as such a heating apparatus. Therefore for ease of description and understanding, heating apparatus 70 will heretofore be referred to as laser generation apparatus 70, although it should be understood that other heating elements capable of such energy output modulation can be used. In a similar manner, position control unit 72 will be understood to be a combination of a computer and mechanical components configured in a manner to be capable of directing the position of any high energy optical source, but for ease of description and understanding will be referred to heretofore as laser position control unit 72. The scope of the present invention is not intended to be limited by the use of this laser terminology, and heating sources other than lasers are understood to be included.

Laser position control unit 72 is capable of moving the position of the output of laser generation apparatus 70 to each of a plurality of portions of a major surface of semiconductor substrate 40 (see FIG. 1), thus differentially heating localized portions of substrate 40 (see FIG. 1). In effecting this movement, laser position control unit 72 utilizes a heating profile map 130 generated by heating profile generating computer 85 and can further effect the modulation both of the energy output from laser generation apparatus 70, and the dwell time for each portion of the major surface of semiconductor substrate 40 (see FIG. 1) in accordance with the thickness of portions thereof as detailed by profile map 130.

As one skilled in the art knows, such modulation of energy output and/or dwell time from one portion to another will result in differential heating of each portion of semiconductor substrate 40 scanned, resulting in differential etch rates of semiconductor material for each portion. It will be understood, from EQ. 1, that increases in temperature result in proportional increases in etch rate, all other process variables remaining constant. For example, in the case of etching silicon with atomic fluorine the etch rate is given by the equation:

$$\text{Etch Rate} = Cn_f T^{1/2} e^{E_{act}/RT} \quad \text{(EQ. 1)}$$

where C=2.86E12; $E_{act}$=2.48 kilocalories/mole; and the atomic fluorine concentration is $n_f$=3.05E15 atoms/cubic centimeter, the etch rate of silicon is calculated to be:

ER=225 nanometers/minute at 25° C.
ER=6000 nm/min at 100° C.
ER=12000 nm/min at 200° C.

Thus, laser position control unit 72 will differentially heat each portion of the plurality of portions to effect a differential etch rate for each portion, such that thicker portions of substrate 40 (see FIG. 1) are heated to a higher temperature than thinner portions. This will cause the thicker portions to etch at a faster rate than the thinner portions, thereby enhancing uniformity.

It will be understood by one skilled in the art that while some portions of substrate 40 (see FIG. 1) are differentially heated to produce increased etch rates for those portions, that all portions of substrate 40 (see FIG. 1) are etching at some base etch rate determined by the chemistry employed and the temperature of temperature controlled chuck 52. Thus differential heating will reduce the TTV of the remaining semiconductor material when the predetermined final thickness is obtained.

Figure 3:
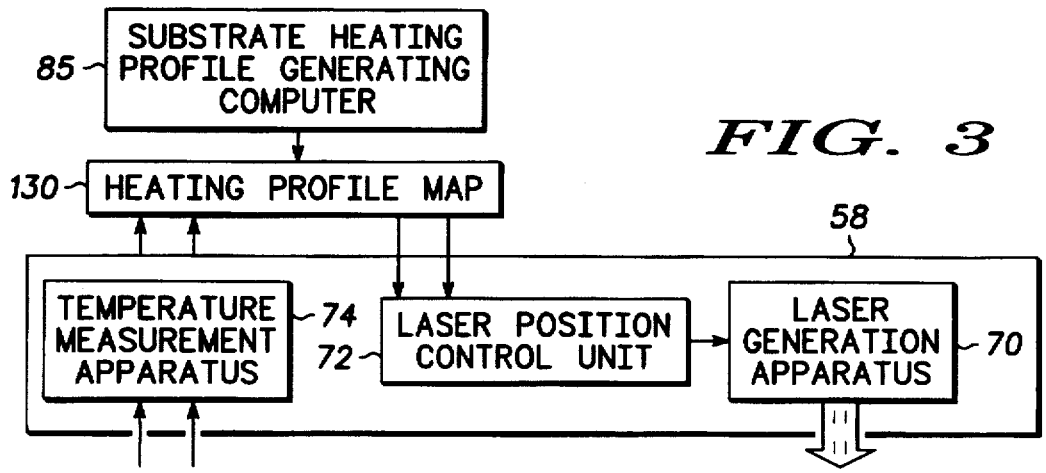
FIG. 3 is a schematic representation of another embodiment of a laser scan unit of a LAPCE chamber.

In FIG. 3, laser scan unit 58 comprises laser generation apparatus 70, laser position control unit 72 as described above with regard to FIG. 2, and temperature measurement apparatus 74. In this embodiment, temperature measurement apparatus 74 functions to perform dynamic temperature measurements of each portion of the major surface of substrate 40 through transparent window 54 (see FIG. 1). Thus measurement apparatus 74 will be understood to comprise a combination of a computer and mechanical components configured in a manner to be capable measuring a temperature of each portion of the major surface of substrate 40 (see FIG. 1), for example by infrared thermography. These dynamic temperature measurements provide feedback to heating profile generating computer 85 allowing dynamic updating of heating profile map 130. Laser position control unit 72 then utilizes updated heating profile map 130 thus enhancing control of the differential heating and of the resulting etch rates such that a substrate of a predetermined thickness with uniformity enhanced with respect to that of the embodiment described above and in FIG. 2, is obtained.

Figure 4:
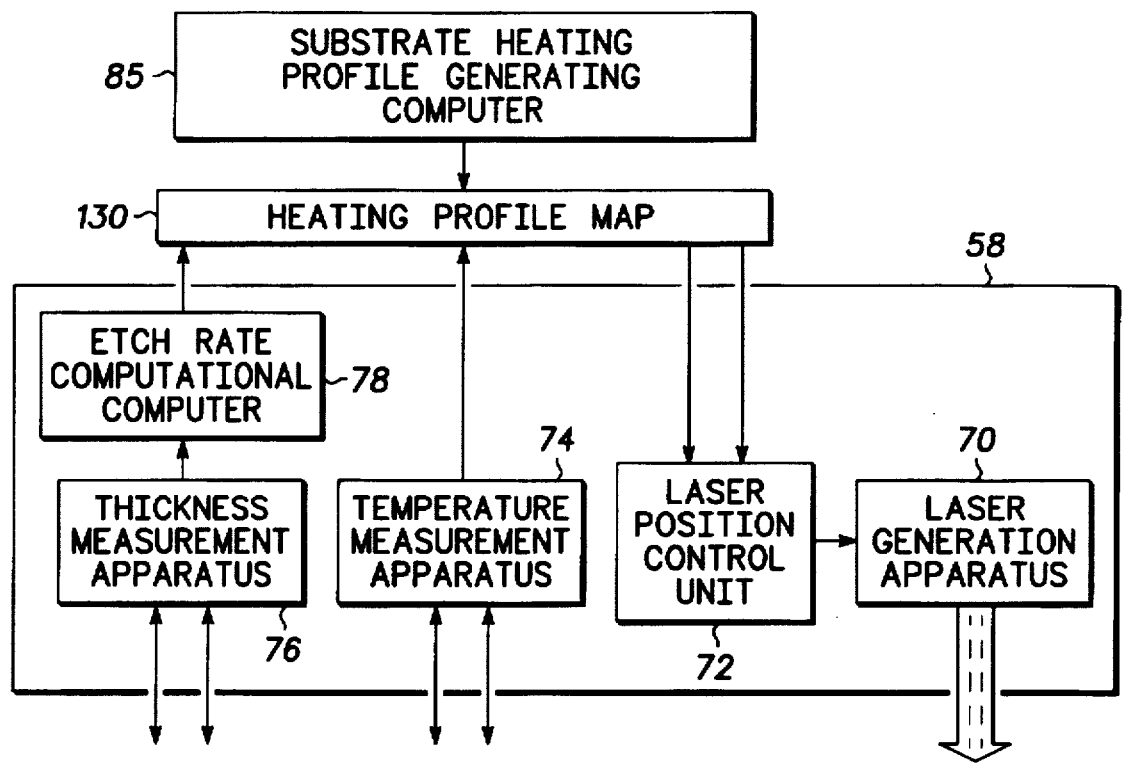
FIG. 4 is a schematic representation of another embodiment of a laser scan unit of a LAPCE chamber.

In FIG. 4 laser scan unit 58 comprises laser generation apparatus 70, laser position control unit 72, temperature measurement apparatus 74, thickness measurement apparatus 76 and etch rate computational computer 78. Laser generation apparatus 70, position control unit 72 and temperature measurement apparatus 74 are to be understood as described above and in FIGS. 2 and 3.

In this embodiment, thickness measurement apparatus 76 functions to perform dynamic thickness measurements. Thickness measurement apparatus 76 can comprise an optical measuring unit, such as a laser interferometer, coupled to a combination of computational and mechanical components configured to allow an initial thickness measurement and subsequent thickness measurements to be made at each portion of the major surface of substrate 40 (see FIG. 1) during etching. Feedback of thickness measurements for each portion scanned is directed to etch rate computational computer 78 where an etch rate for each portion of the major surface of semiconductor substrate 40 is calculated. Etch rate computational computer 78 comprises a computer capable of performing dynamic etch rate calculations. This dynamic etch rate data is directed to heating profile generation computer 85 to allow dynamic updating of heating profile map 130. Laser position control unit 72 then utilizes updated heating profile map 130 thus enhancing control of the differential heating and etching for each of the plurality of portions to provide enhanced control of the etch rate for each portion such that an extremely uniform substrate of a predetermined thickness can be obtained. In this embodiment, temperature measurement apparatus 74 is represented as an optional functioning unit. As one skilled in the art will realize, temperature measurement apparatus 74 can be employed, in the manner of the embodiment associated with FIG. 3, in conjunction and in addition to thickness measurement apparatus 76 to provide additional data and further enhance control of etch rates.

Figure 5:
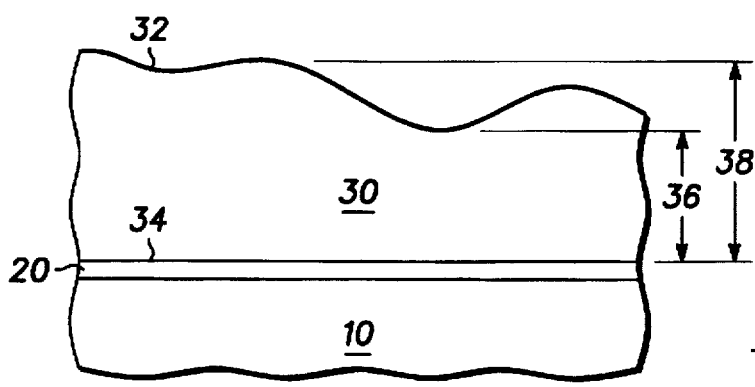
FIG. 5 is a highly magnified cross sectional representation of a semiconductor substrate.

A portion of an exemplary semiconductor substrate 40 is illustrated in FIG. 5. Semiconductor substrate 40 is composed of handle wafer 10, dielectric layer 20 overlying handle wafer 10, and device wafer 30 overlying dielectric layer 20. For a typical silicon-on-insulator (SOI) substrate 40, device wafer 30 is single crystal silicon having an initial thickness on the order of about 200 to 500 µm. Dielectric layer 20 is silicon dioxide and handle wafer 10 is a silicon wafer. As one skilled in the art is aware, a typical TTV for such a bonded device wafer 30 would be approximately 10 µm, but values as high as 50 µm are not unusual. This thickness variation is represented in FIG. 5 by the non-parallel representations of major surface 32 and lower surface 34 of device wafer 30 and first thickness 36 and second thickness 38. Thus device wafer 30 could have a TTV of approximately 10 µm where first thickness 36 is, for example 40 µm and second thickness 38 is, for example 50 µm. It will be understood by one skilled in the art, that if thickness 36 represents a first portion 36, and thickness 38 a second portion 38 of a plurality of portions, that during the LAPCE process, second portion 38 would be differentially heated to produce a higher etch rate than first portion 36. This differential heating will be maintained until the thickness of the two portions is equal, thus providing an extremely uniform film thickness.

Figure 6:
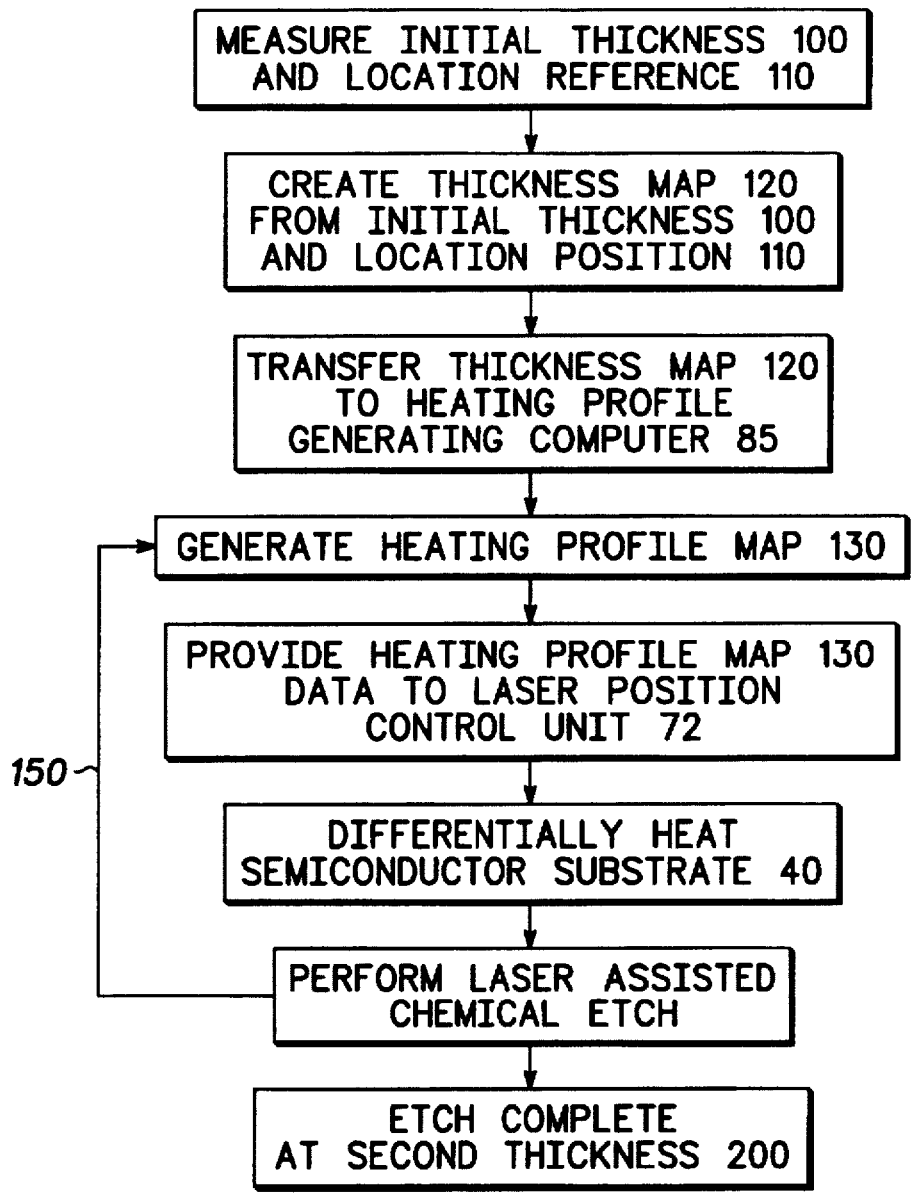
FIG. 6 is a block diagram of the major steps of the LAPCE process.

FIG. 6 is a block diagram representative of the Laser Assisted Plasma Chemical Etch process (LAPCE). Initial thickness 100 is measured at each of a plurality of portions of major surface 32 of device wafer 30 (see FIG. 5) and a thickness profile map 120 comprised of thickness and location data is created therefrom. While initial thickness 100 may be measured on a full thickness device wafer 30 (see FIG. 5), typically a preliminary thinning step, such as mechanical grinding or chemical-mechanical polishing, is performed to bring device wafer 30 (see FIG. 5) to an initial thickness 100 close to a predetermined final thickness 200. Initial thickness 100 of device wafer 30 (see FIG. 5) can be measured at each of a plurality of portions of a major surface of device wafer 30 (see FIG. 5) by either stand-alone measurement and thickness profile generating systems, or by modules having this functionality and integrated into the LAPCE system as previously discussed. For each measurement of initial thickness 100, a location reference 110 is also generated. Thus an initial thickness 100 and location reference 110 is generated for each of the plurality of portions of the major surface of device wafer 30 and thickness profile map 120 is generated therefrom.

Once thickness profile map 120 is created, it is transferred to heating profile generating computer 85 where heating profile map 130, which is used to control laser position control unit 72, is generated therefrom. One skilled in the art will realize that the embodiments of the present invention, as represented in FIGS. 3 and 4, are dynamically controlled etching processes. Each embodiment requires the dynamic updating of heating profile map 130. Therefore, referring again to FIG. 6, arrow 150 represents the repetitive feedback and recalculation of heating profile map 130 that comprises such a dynamically controlled process as previously described.

By now it should be appreciated from the description and figures provided that a novel Laser Assisted Plasma Chemical Etch apparatus and method have been described. The present invention provides both an apparatus and method for thinning a semiconductor substrate 40 (see FIG. 1) with a dynamic feedback loop that can provide extremely uniform, thin high quality semiconductor layers. In comparison with prior art mechanical or chemical-mechanical processing, improvements in both ultimate thickness control, TTV and surface quality can be obtained. With regard to prior art etch technology, the removal of mechanical motion from within the process chamber during etching, dynamic updating of heating profile maps and the use of low damage downstream etching all contribute to higher quality and process control. In addition, the ability to etch the entire wafer at all times, as opposed to the scanning confined plasma of prior art etch technology provides for improved throughput and resulting lower costs. Finally, the ability to define extremely small portions of a surface, as compared to prior art etch technology, allow for significant improvements in film uniformity without sacrificing throughput or layer surface quality.

We claim:

1. A method for removing material from a semiconductor substrate to thin and smooth said semiconductor substrate, comprising the steps of:

measuring uniformity of thickness of said semiconductor substrate;

generating a heating profile map from the uniformity of thickness measurement;

placing the semiconductor substrate in an etching chamber;

differentially heating localized portions of said semiconductor substrate in accordance with said heating profile map so that thicker localized portions are at a higher temperature and thinner localized portions of said semiconductor substrate are at a lower temperature; and etching an entire surface of said semiconductor substrate, wherein the localized portions of said semiconductor substrate that are at a higher temperature are etched at a faster rate than the localized portions of said semiconductor substrate that are at a lower temperature.

2. The method of claim 1, wherein the step of placing a semiconductor substrate in an etching chamber includes placing a semiconductor substrate comprised of a handle wafer bonded to a device wafer.

3. The method of claim 1, wherein the step of etching the semiconductor substrate further includes etching a device wafer to a predetermined thickness.

4. The method of claim 3, wherein the device wafer is comprised of a silicon wafer.

5. The method of claim 3, wherein the device wafer is comprised of III-V semiconductor material.

6. The method of claim 1, wherein the step of etching an entire surface of the semiconductor substrate further includes monitoring the uniformity of thickness of said semiconductor substrate to determine the localized portions of said semiconductor substrate that require differential heating.

7. The method of claim 1, wherein the step of measuring uniformity of thickness of said semiconductor substrate further comprises measuring an initial thickness at each of a plurality of portions of a major surface of said semiconductor substrate.

8. The method of claim 7, wherein the step of measuring uniformity of thickness of said semiconductor substrate further comprises measuring thickness using an optical measuring unit.

9. The method of claim 1, wherein the step of differentially heating localized portions of said semiconductor substrate further comprises heating using a laser.

10. The method of claim 1, wherein the step of measuring uniformity of thickness of said semiconductor substrate further comprises measuring an initial thickness at a plurality of portions of a major surface of said semiconductor substrate and after some etching has been performed subsequently measuring a subsequent thickness at each of the plurality of portions and calculating an etch rate for the plurality of portions and calculating a heating profile map utilizing the measured thickness and the calculated etch rate data.

11. The method of claim 10, wherein the heating profile map calculated is used to determine the localized portions of said semiconductor substrate that require differential heating.

12. The method of claim 1, wherein the step of differentially heating localized portions of said semiconductor substrate further comprises measuring a temperature and calculating an etch rate for the localized portions and calculating a heating profile map therefrom.

13. A method for producing thin, uniform device wafers, comprising the steps of:

providing a wafer substrate in an etching chamber, wherein said wafer substrate further comprises a handle wafer bonded to a device wafer having a major surface;

measuring an initial thickness of said device wafer at a plurality of portions of said major surface;

heating thicker portions of said major surface to a higher temperature than thinner portions of said major surface;

etching the entire major surface of said device wafer wherein an etch rate of a thicker portion of said major surface will be higher than an etch rate of a thinner portion of said major surface;

measuring a subsequent thickness of said device wafer at a plurality of portions;

calculating an etch rate for said plurality of portions;

calculating a heating profile map wherein said heating profile map is determined by thickness and etch rate data for said plurality of portions;

heating said plurality of portions to a temperature determined by heating profile map; and repeating the etching, measuring, calculating and heating steps until said device wafer is a predetermined thickness.

14. The method of claim 13, wherein the step of providing a wafer substrate in an etching chamber includes a downstream plasma etching chamber.

15. The method of claim 13, wherein the steps of heating include heating with a laser generation apparatus.

16. The method of claim 13, wherein the step of calculating a heating profile map further comprises measuring temperatures of said plurality of portions for use in said step of calculating.

* * * * *